(12) United States Patent
Soong et al.

(10) Patent No.: US 7,349,501 B2
(45) Date of Patent: Mar. 25, 2008

(54) METHOD AND APPARATUS FOR AUTOMATIC GAIN CONTROL OF A WIRELESS RECEIVER

(75) Inventors: Anthony C. K. Soong, Superior, CO (US); David Purdy, Westminster, CO (US); Larry Flowers, Westminster, CO (US)

(73) Assignee: Telefonaktiebolaget LM Ericsson (publ) (SE)

( * ) Notice: Subject to any disclaimer, the term of this patent is extended or adjusted under 35 U.S.C. 154(b) by 721 days.

(21) Appl. No.: 10/888,452

(22) Filed: Jul. 9, 2004

(65) Prior Publication Data
US 2005/0031058 A1   Feb. 10, 2005

Related U.S. Application Data

(60) Provisional application No. 60/486,933, filed on Jul. 14, 2003.

(51) Int. Cl.
    *H04L 27/08* (2006.01)
(52) U.S. Cl. .................................................. 375/345
(58) Field of Classification Search ............... 375/317, 375/345; 455/218–219, 222
    See application file for complete search history.

(56) References Cited

U.S. PATENT DOCUMENTS

| | | | | |
|---|---|---|---|---|
| 5,083,304 | A | * | 1/1992 | Cahill ........................ 375/345 |
| 5,276,685 | A | * | 1/1994 | Kepler et al. .............. 370/332 |
| 5,727,031 | A | * | 3/1998 | Solve et al. ............... 375/345 |
| 5,999,559 | A |   | 12/1999 | Takaki |
| 6,563,891 | B1 |  | 5/2003 | Eriksson et al. |
| 2003/0026363 | A1 | * | 2/2003 | Stoter et al. .............. 375/345 |

FOREIGN PATENT DOCUMENTS

| | | |
|---|---|---|
| EP | 0 455 388 | 11/1991 |
| EP | 0 496 507 | 7/1992 |
| GB | 2 330 960 | 5/1999 |

OTHER PUBLICATIONS

Patent Abstracts of Japan vol. 0143, No. 36 (E-0953) Jul. 19, 1990 & JP 2 113612 A (NEC Corp); Apr. 25, 1990.
Patent Abstracts of Japan vol. 0163, No. 72 (E-1246), 11 Ausut 1992 & JP 4 117837 A (Canon Inc), Apr. 17, 1992.
Patent Abstracts of Japan, vol. 0143, No. 36 (E-0953), Jul. 19, 1990 & JP 02 113612 A (NEC Corp), Apr. 25, 1990.
Patent Abstracts of Japan, vol. 0163, No. 72 (E-1246), Aug. 11, 1992 & JP 04 117837 A (Cannon Inc), Apr. 17, 1992.

* cited by examiner

*Primary Examiner*—Khanh C. Tran
(74) *Attorney, Agent, or Firm*—Coats & Bennett, P.L.L.C.

(57) ABSTRACT

A method and apparatus for automatic gain control of a receiver provides compensation of gain control operations for received signal disruptions. In one embodiment, an automatic gain control circuit remembers control state information from a time just before a given disruption, and uses it to reset the automatic gain control circuit at the end of the disruption, or to maintain the automatic gain control circuit during the disruption. The remembering function may be triggered, such by detecting an impending disruption, or done periodically at a high enough update rate that the remembered information is always current with respect to any given disruption. Thus, an exemplary automatic gain control circuit may generate a receiver gain control signal by filtering received signal power measurements, and compensate the generation of that gain control signal by capturing filter state information just prior to signal disruptions. Compensation may comprise resetting or freezing the filter.

31 Claims, 4 Drawing Sheets

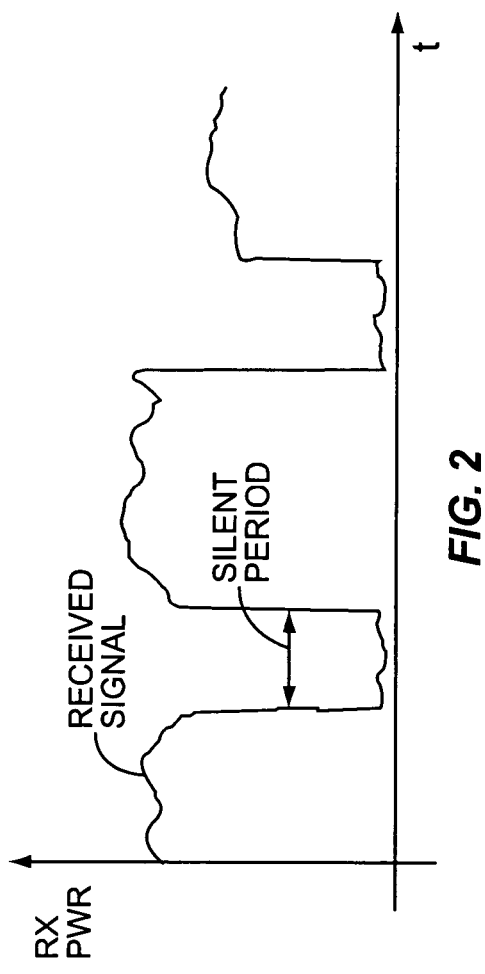
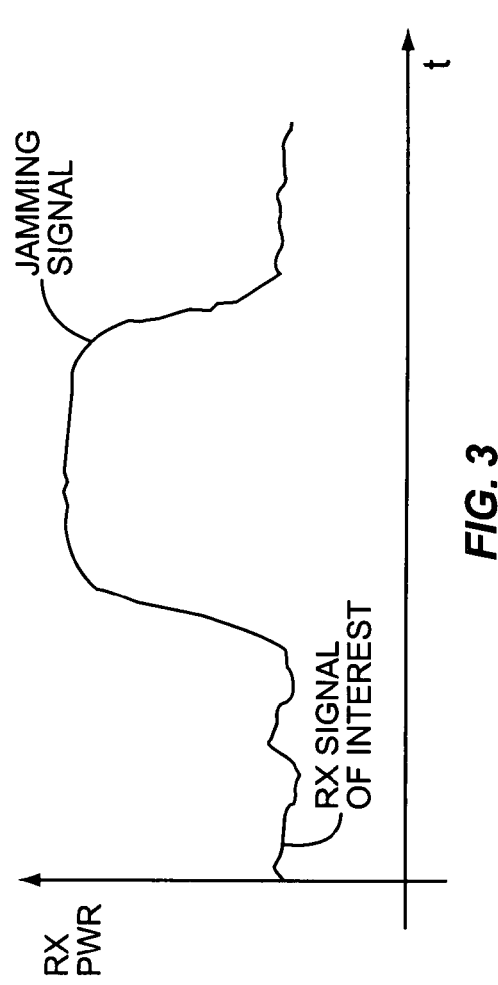

METHOD AND APPARATUS FOR AUTOMATIC GAIN CONTROL OF A WIRELESS RECEIVER

RELATED APPLICATIONS

This application claims priority under 35 U.S.C. §119(e) from the following U.S. provisional application: Application Ser. No. 60/486,933 filed on Jul. 14, 2003. That priority application is incorporated by reference herein.

BACKGROUND OF THE INVENTION

The present invention generally relates to wireless communication receivers, and particularly relates to automatic gain control of such receivers.

Most communication receivers use some form of automatic gain control (AGC) to maintain received signals within a desired range. For example, a typical wireless communication receiver obtains digitized samples of a received signal of interest based on digitizing a baseband analog signal derived from an incoming analog received signal of interest, e.g., an antenna receiving an over-the-air communication signal.

Those skilled in the art will appreciate that satisfactory digitization depends on maintaining the analog input signal within a defined signal (voltage) range that is appropriate for the analog-to-digital converter (ADC) being used to digitize the signal. On the one hand, the analog input signal must be kept below the upper voltage limit of the ADC's input range to avoid saturation, and on the other hand, the analog input signal must be kept at a high enough signal level for acceptable quantization accuracy. That is, the input signal's range generally should span all or nearly all of the defined input voltage range of the ADC to realize the full quantization accuracy of the ADC. For example, a 10-bit ADC configured for a 0-to-5 Volt input signal range operates with an effective resolution of 9 bits or less if the actual input signal range is only 2.5 Volts.

In this context, then, an AGC circuit is configured to track the incoming received signal strength, for example, and to adjust one or more receiver gain elements as needed to maintain a desired input signal range to the ADC. Of course, AGC has applicability beyond controlling the input signal range for receive chain ADCs, and may be used to prevent the saturation of analog amplifiers, filters, etc., within the receive chain, such as by varying the gain of one or more amplifier or preamplifier stages.

However applied, convention AGC functions may be upset by significant disruptions in the signal being used as the reference for AGC. For example, the temporary loss of the received signal causes the convention AGC function to ramp receiver gain upward in an attempt to boost the low or non-existent received signal strength. While that behavior represents proper AGC functionality, it can cause temporary saturation problems when the received signal returns. Similar kinds of under- or over-boosting problems arise with other types of signal disruptions, such as signal jamming, etc., wherein the conventional AGC function may suffer undesirable control lags with respect to the transitions between abnormal (disrupted) and non-disrupted (normal) signal conditions.

SUMMARY OF THE INVENTION

The present invention comprises a method and apparatus for automatic gain control of a receiver, such as a wireless communication receiver in a radio base station for use in a wireless communication network. Receiver gain control varies receiver gain to maintain the received signal within a desired signal range and, in accordance with the present invention, automatic gain control is compensated for disruptions in the received signal, e.g., interruptions in the received signal caused by repeating silence periods or sporadic signal jamming, for example. Broadly, such compensation resets the automatic gain control circuit coming out of a signal disruption using remembered gain control information that was stored in advance of the disruption, or uses such information to maintain, e.g., freeze, gain control through the disruption.

In one embodiment, the present invention comprises a method of automatic gain control at a wireless communication receiver. That method comprises capturing an automatic gain control setting at a time prior to a disruption in a received signal that is the subject of automatic gain control, and temporarily using the captured automatic gain control setting to compensate automatic gain control for each disruption. Capturing an automatic gain control setting at a time prior to the disruption in the received signal may comprise capturing filter state information for an automatic gain control circuit at a time prior to a beginning of the disruption.

The captured filter state information may be used to reset gain control filtering at the end of the disruption, or to maintain a given filter state during the disruption. In that latter case, the gain control circuit can be configured to suspend filter update operations while the received signal is disrupted. Note that freezing gain control during the disruption can lead to receiver saturation during high power disruptions of the received signal (e.g., jamming), and thus may be less preferable to maintaining live gain control during the disruption, followed by an end-of-disruption gain control reset using remembered state information as described above. Further, in radio base station receivers, the disruptions may comprise silence periods that allow for noise characterization of the base station receiver(s), in which case it generally will be preferable to maintain live gain control during the disruptions to aid accurate receiver noise measurements.

Thus, in one embodiment, the present invention comprises a radio base station for use in a wireless communication network. The radio base station comprises one or more receivers configured to receive a reverse link signal as a received signal, and an automatic gain control circuit included in, or associated with, the one or more receivers. In an exemplary embodiment, the automatic gain control circuit is configured to vary a receiver gain responsive to the received signal, and compensate automatic gain control of the one or more receivers based on remembered control state information if the received signal is disrupted. The remembered control state information may be saved for the automatic gain control circuit at a time prior to the disruption. Note that one or more automatic gain control circuits may be configured for each sector's radio receiver(s) in a multi-sector radio base station.

In this context, the base station may be configured such that its automatic gain control circuit(s) capture gain control state information in advance of periodic silence periods. The base station may use timers or other monitoring circuits to trigger the remembering of control state information in advance of each silence period. Then, the base station continues live automatic gain control as it characterizes receiver noise levels during the silence period, and uses the remembered information to reset its gain control coming out of each silence period. Because the received signal level is low or non-existent during each silence period, automatic gain control tends toward high-gain conditions, so the act of resetting automatic gain control at the end of the silence period using remembered control state information avoids or reduces receiver saturation that might otherwise occur when the received signal "returns."

Of course, it should be understood that silence periods represent one type of signal disruption compensated for by the present invention, and that the present invention has applicability to a wide range of signal disruptions including, as mentioned before, instances of signal jamming wherein the desired received signal essentially is swamped out by a higher powered jamming signal. Thus, in these and other instances of signal disruption, the present invention broadly comprises a method of automatic gain control at a wireless communication receiver based on capturing an automatic gain control setting at times just prior to disruptions in a received signal that is the subject of automatic gain control, and temporarily using the captured automatic gain control setting to compensate automatic gain control for each disruption.

With respect to capturing gain control settings, or otherwise remembering control state information for disruption compensation according to the present invention, an automatic gain control circuit, or a supporting circuit, can be configured to detect an impending disruption, e.g., an upcoming timed silence period, and capture control state information just before the beginning of that period. Additionally, or alternatively, the circuit(s) can be configured to maintain a running buffer of control state information.

The stored information can be updated according to a desired sample time (i.e., storage update interval), and updating may be suspended during any disruption to preserve the stored information. In one embodiment, the automatic gain control circuit is configured to detect a start of the disruption, and use saved control information from the closest sample time before the detected start of the disruption as the remembered control state information that is used to compensate automatic gain control. Of course, other variations are possible.

As such, it should be understood that the present invention is not limited by the above information. Indeed, those skilled in the art will recognize additional features and advantages of the present invention upon reading the following detailed description in which several exemplary embodiments are described, and upon viewing the accompanying figures.

BRIEF DESCRIPTION OF THE DRAWINGS

FIGS. 2 and 3 are diagrams of two of the various types of received signal disruptions of interest with respect to automatic gain control according to the present invention.

DETAILED DESCRIPTION OF THE INVENTION

Figures 1, 4:
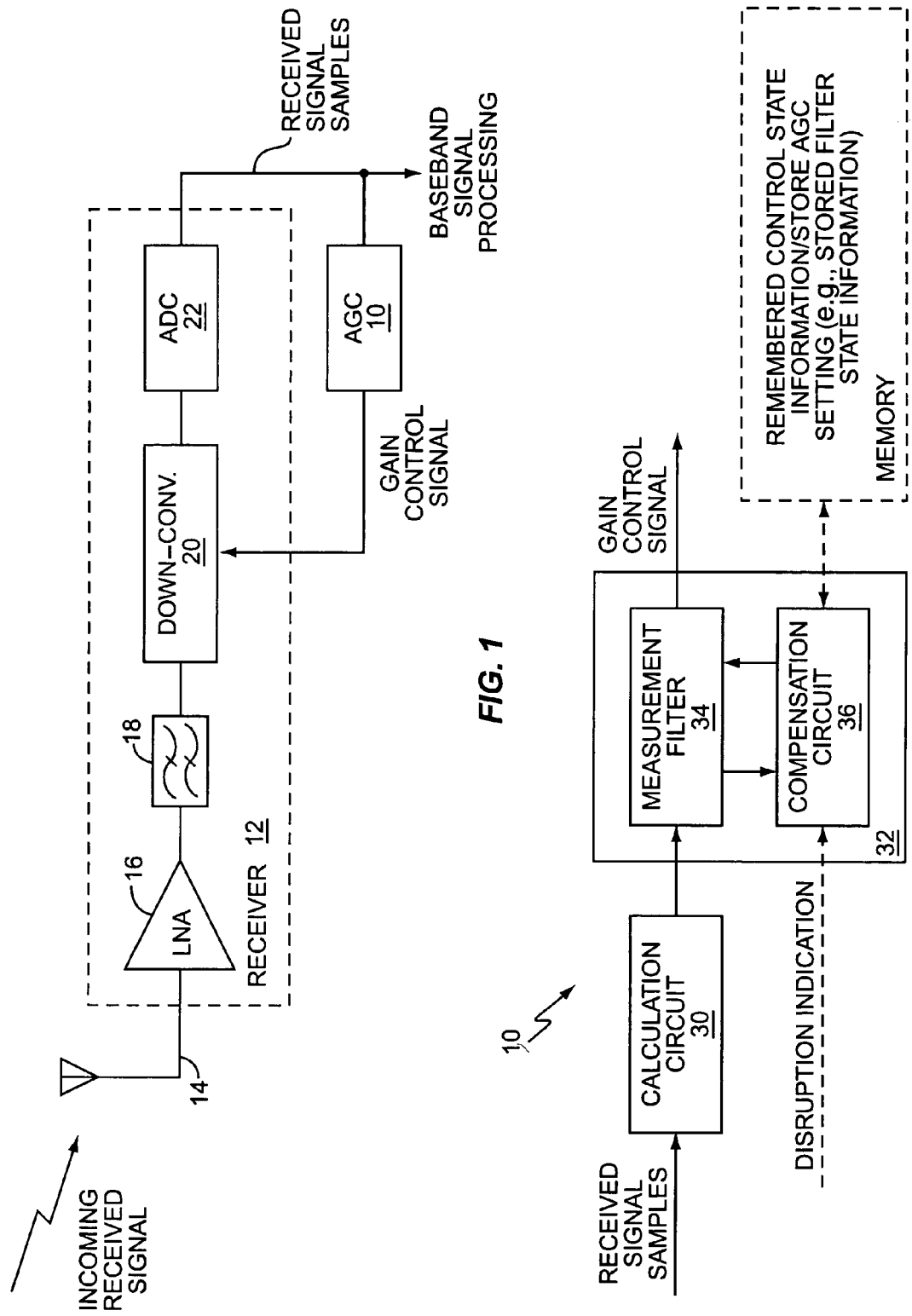
FIG. 1 is a diagram of an exemplary Automatic Gain Control (AGC) circuit illustrated in association with an exemplary wireless communication receiver.
FIG. 4 is a diagram of exemplary functional details for one or more embodiments of the AGC circuit of FIG. 1.

FIG. 1 is a diagram of an automatic gain control (AGC) circuit 10 according to one or more embodiments of the present invention. AGC circuit 10 is associated with or included in a receiver 12, such as the type of receive chain circuit that might be included in a radio base station within a wireless communication network. Receiver 12 is associated with an antenna 14 and, by way of non-limiting example, comprises a low-noise amplifier (LNA) 16, analog filter circuit 18, a down-converter circuit 20, and an analog-to-digital converter (ADC) circuit 22.

In operation, receiver 12 obtains an incoming received signal via antenna 14, which it amplifies, filters, and down-converts to a baseband frequency using LNA 16, filter 18, and down-converter 20. Down-converter 20 may comprise two or more mixing stages, and thus may take the received signal from its carrier frequency band to an intermediate frequency (IF), and then down to a baseband frequency. Alternatively, down-converter 20 may comprise a direct conversion down-convert that takes the received signal directly to baseband. Of course, other implementations are possible, and it should be understood that there can be filtering and gain stages at IF and/or baseband in addition, or as an alternative, to that depicted.

Regardless, down-converter 20 provides an analog input signal to ADC 22 that corresponds to the incoming received signal. Note that two signals corresponding to in-phase and quadrature components of the received signal may be provided to ADC 22. In any case, ADC 22 digitizes the analog input signal(s) and correspondingly outputs one or more streams of baseband received signal samples at a defined sample rate.

Those skilled in the art will appreciate that satisfactory digitization depends on maintaining the analog input signal to ADC 22 within a defined signal (voltage) range. Thus, AGC circuit 10 is operative to vary one or more gains of receiver 12 responsive to changes in the received signal to maintain the input signal(s) to ADC 22 within the desired signal range. By way of non-limiting example, down-converter circuit 20 may comprise one or more variable gain circuits, e.g., variable gain amplifiers/mixers, that are responsive to one or more AGC signals output from AGC circuit 10. In this manner, AGC circuit 10 reduces receiver gain as the received signal strength increases and, conversely, increases receiver gain as the received signal strength decreases. Note that the AGC signal(s) output from AGC circuit 10 may be analog or digital depending on the nature of the particular variable gain circuits being controlled in the receiver chain.

However, with particular respect to the present invention, AGC circuit 10 is configured to compensate its ongoing AGC operations responsive to disruptions in the received signal. To understand at least some of the advantages attendant to AGC compensation, FIGS. 2 and 3 illustrate non-limiting examples of received signal disruptions. In a first instance, the incoming received signal may, as shown in FIG. 2, be interrupted by one or more "silence" periods. Because of the low received signal strength as measured during such silence periods, the conventional AGC circuit tends to drive receiver gain upward, possibly toward a maximum gain value, which causes undesirable saturation of the receive chain at the end of the silence period when the received signal returns.

For the interested reader, it may be noted that the sort of silence period illustrated in FIG. 2 is used, for example, in certain types of wireless communication networks. For example, CDMA data networks based on 1xEV-DO or TIA-856 standards use region-wide or network-wide "silence" periods, during which reverse link transmissions are suspended. That temporary suspension permits radio base stations in the network(s) to measure the background or thermal noise of their receivers. Such measurements provide a reference noise measurement that can be used later, after the reverse link is reactivated, to measure radio base station loading on the reverse link. In other words, the silence periods provide the radio base stations to determine their thermal noise, which noise value then serves as the reference for "Rise-Over-Thermal" (ROT) reverse link loading measurements.

Of course, disruptions of any type may occur, and may be compensated by the AGC circuit 10 of the present invention. For example, FIG. 3 illustrates another instance of received signal interruption, wherein a stronger interfering signal "jams" the received signal of interest by effectively swamping it out at the receiver. One might observe that jamming, as compared to silence, causes the opposite AGC problem, in that convention AGC circuits tend to drive receiver gain down to some minimum gain value responsive to the high-power jamming condition. While that behavior is appropriate to avoid receive chain saturation during jamming, it leaves the conventional AGC circuit at a too-low gain setting when the jamming condition is relieved.

Thus, conventional automatic gain control response "lags" the actual received signal at the end of received signal disruptions. That lagging behavior results in erroneous receiver gain control until the conventional AGC circuit "catches up" to the changed received signal conditions.

According to the present invention, the AGC circuit 10 avoids these and other problems by compensating AGC operations with respect to received signal disruptions based on remembered control state information. By way of non-limiting example, FIG. 4 illustrates exemplary details for AGC circuit 10. The illustrated AGC circuit 10 comprises a calculation circuit 30 to generate measurements corresponding to the received signal(s) of interest, and a control circuit 32 to generate one or more AGC signals for controlling receiver gain responsive to the measurements.

For example, calculation circuit 30 may generate received signal power measurements at a desired measurement rate, based on processing baseband received signal samples as output by the ADC 22. In turn, AGC circuit 10 can be configured to generate an output gain control signal responsive to those power measurements. In a preferred configuration, control circuit 32 includes a filter circuit 34 that is configured to generate an AGC signal based on filtering the power measurements as output by calculation circuit 30. Those skilled in the art will appreciate that filter circuit 34 may comprise essentially any type of filter, e.g., Infinite-Impulse-Response (IIR), Finite-Impulse-Response (FIR), exponential weighting, etc. In one embodiment, filter circuit 34 comprises IIR or FIR filter of one or more poles having a filter output that depends on the current measurement value, and one or more filter state values.

Thus, the "remembered" control state information may comprise filter state information. Simply put, compensation circuit 36 can be configured to save filter state information for filter circuit 34 from a time just before a signal disruption, and then "reset" filter circuit 34 by reloading that remembered filter state information as the signal disruption ends. In that manner, the convergence time of filter circuit 34 is greatly reduced as the received signal level returns to at or about the level it had before the disruption. Notably, this approach allows the AGC circuit 10 to remain "live" during the disruption. That is, AGC circuit 10 can continue measuring the received signal and updating its AGC signal output to reflect the changing signal conditions of the disruption and still quickly return to its pre-disruption control state, or thereabouts, by, when the disruption ends, reloading control state information captured from a time just before the current disruption event.

Because filter state information can be capture periodically, the AGC circuit 10 may reset itself after a disruption, or freeze itself during the disruption, based on the captured settings from a single capture time, e.g., the capture time closest to the beginning of the disruption. However, it should be understood that a buffer of more than one captured filter states can be maintained, so resetting or freezing the AGC circuit 10 can be based on averaging the last N filter states captured in advance of the disruption, where N is some number limited by the buffer depth and set according to a desired averaging function. Those skilled in the art will recognize the implementation variations available where the AGC circuit 10 is configured to maintain a queue of last-known-good control settings or values.

Figure 5:
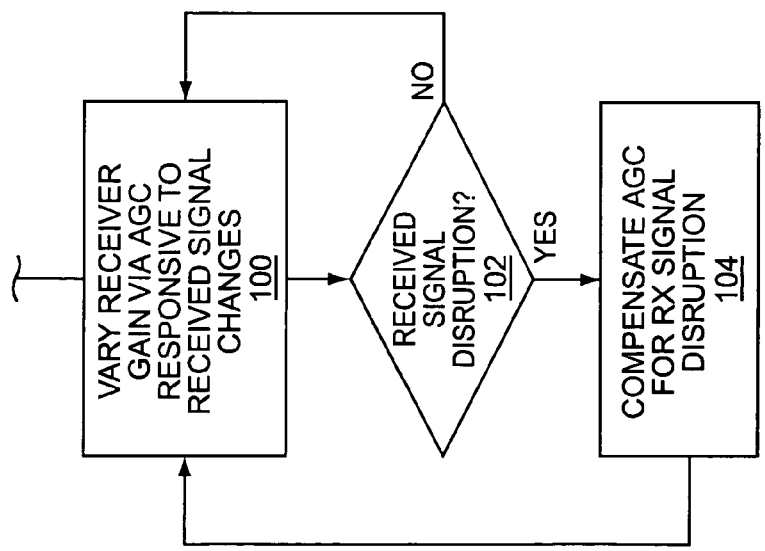

With the above in mind, FIG. 5 illustrates exemplary processing logic for the AGC circuit 10, wherein AGC circuit 10 varies receiver gain responsive to received signal changes (Step 100). Processing continues with AGC 10 receiving an indication of received signal disruption (Step 102), in which case it compensates AGC operations responsive to that disruption. Note, that AGC circuit 10 may include processing logic enabling it to detect disruptions, such as by detecting excessive received signal strength (e.g., jamming interruption), or too-low received signal strength (e.g., silence period interruption), or it may rely on supporting logic elsewhere in the receiver to provide disruption detection/control.

Figure 6:
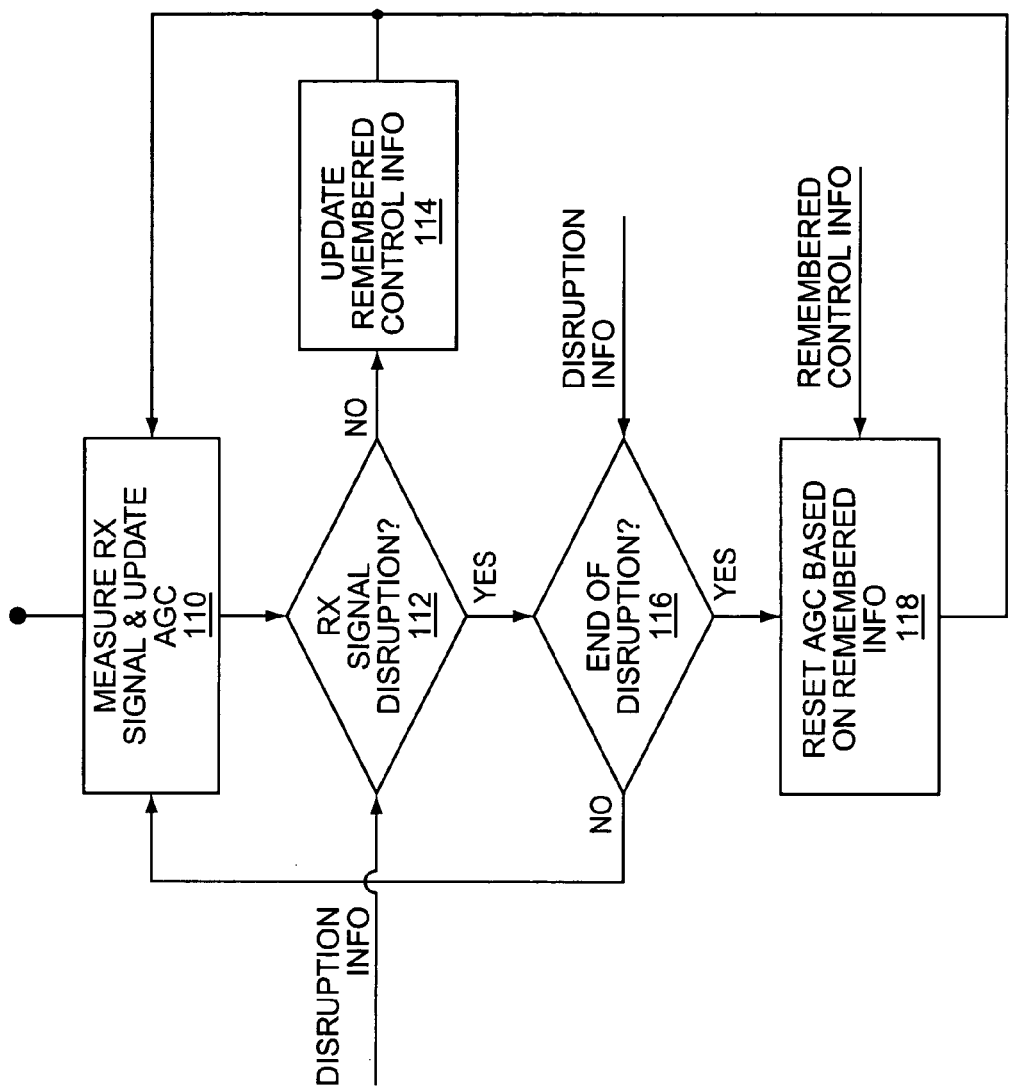
FIGS. 5-7 are diagrams of exemplary processing logic according to one or more embodiments of an automatic gain control method according to the present invention.

Regardless, FIG. 6 illustrates one method of maintaining the remembered control state information used to compensate for signal disruptions. Here, stored control state information is updated on a periodic basis to ensure that relatively recent samples of control state information will be available relative to the occurrence of any given disruption.

In more detail, processing is based on measuring the received signal, directly or indirectly, to obtain an AGC measurement, which is then used to update the current AGC signal value (Step 110). Processing continues with updating the currently stored control state information if the received signal is not currently in a disrupted condition (Steps 112 and 114). Processing returns to the AGC measurement/ control loop of Step 110, once the update of stored information is completed. Note that with this logic, the AGC measurement/control is carried out whether or not the received signal is in a disrupted condition, but the stored control information is not updated during a disrupted signal condition. The selective updating preserves the "last known good" control state information for AGC circuit 10 that was captured in advance of the current disruption.

If the received signal is in a disrupted condition (Step 112), processing continues with a check of whether the disruption is at an end (Step 116). By way of non-limiting examples, this check may be based on timing a known silence period interval, receiving an indication from other processing logic in or associated with the receiver, or by monitoring the received signal. In any case, if the disrupted condition is not at an end, processing returns to the AGC measurement/control loop. On the other hand, if the disruption has ended, or is ending, the compensation circuit 36 of AGC 10 compensates AGC circuit 10 using the remembered control state information to improve its control response relative to the received signal returning to its non-disrupted condition (Step 118).

As noted, such compensation can comprise resetting filter circuit 34 using remembered filter state information. Regardless, the compensation of AGC circuit 10 can be timed so that first control update of AGC circuit 10 at the end of the disruption, or just after it ends, can be based on the control state information captured right before the disruption began. In particular, where the disruption being compensated for is a timed silence period, AGC circuit 10 can be control so that its pre-disruption control state capture and its post-disruption control state reset operations, both are coordinated with respect to the known timing of the silence period.

Thus, AGC circuit 10 can be configured to perform a control state capture on an as-needed basis as an alternative, or in addition, to the above described periodic update process. The pre-disruption, as-needed capturing configuration may be particularly useful in embodiments where the AGC circuit 10 can detect an impending disruption, or is provided with advance indication of such disruptions. As an example, the known timing information associated with one or more silence intervals can be provided to AGC circuit 10, or can be used to trigger its capture/compensate operations.

Figure 7:
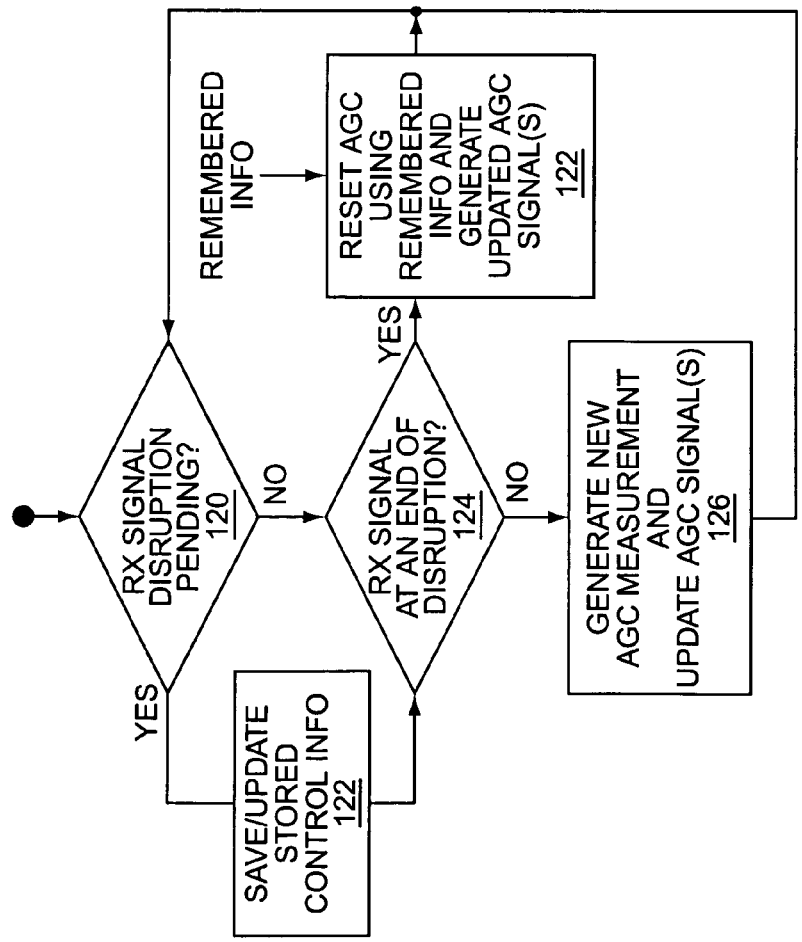

FIG. 7 illustrates such operation, wherein AGC circuit 10 determines whether a signal disruption is pending (Step 120), either based on its timing and/or received signal monitoring, or based on being provided such indication from other circuitry. If a disruption is pending, AGC circuit 10 captures a current gain control setting, e.g., filter state information, current gain control signal value, etc., and updates its stored control information (Step 122). If a disruption is not pending, then AGC circuit 10 determines whether an ongoing disruption, if any, is at an end (Step 124).

If so, the compensation circuit 36 of AGC circuit 10 resets AGC circuit 10 using the remembered control state information, and generates an updated AGC output based on the reset state (Step 128) and processing continues. If the signal is not disrupted, or not at an end of disruption, processing continues from Step 124 with generation of a new AGC measurement based on the current received signal (i.e., whether or not the signal is disrupted), and the AGC signal(s) are updated with respect to the new measurement (Step 126) and processing continues.

In the above processing logic, as in that illustrated by FIG. 6, one sees that the AGC circuit 10 is configured to maintain ongoing automatic gain control before, during, and after any given signal disruption. As noted, maintaining live AGC during the disruption may be desirable where, for example, receiver gain adjustments should be continued through any given disruption to support silence period receiver noise measurements, or to avoid jamming period receiver saturation. However, it should be understood that in the alternative, the AGC state just prior to a given disruption can be saved and then used to "freeze" AGC circuit 10 for the duration of the disruption. Freezing the AGC circuit 10 in this manner prevents receiver gain control from being driven to one extreme or the other (i.e., too high or too low) during the disruption by holding gain control at the same gain setting as was active prior to the disruption.

Figure 8:
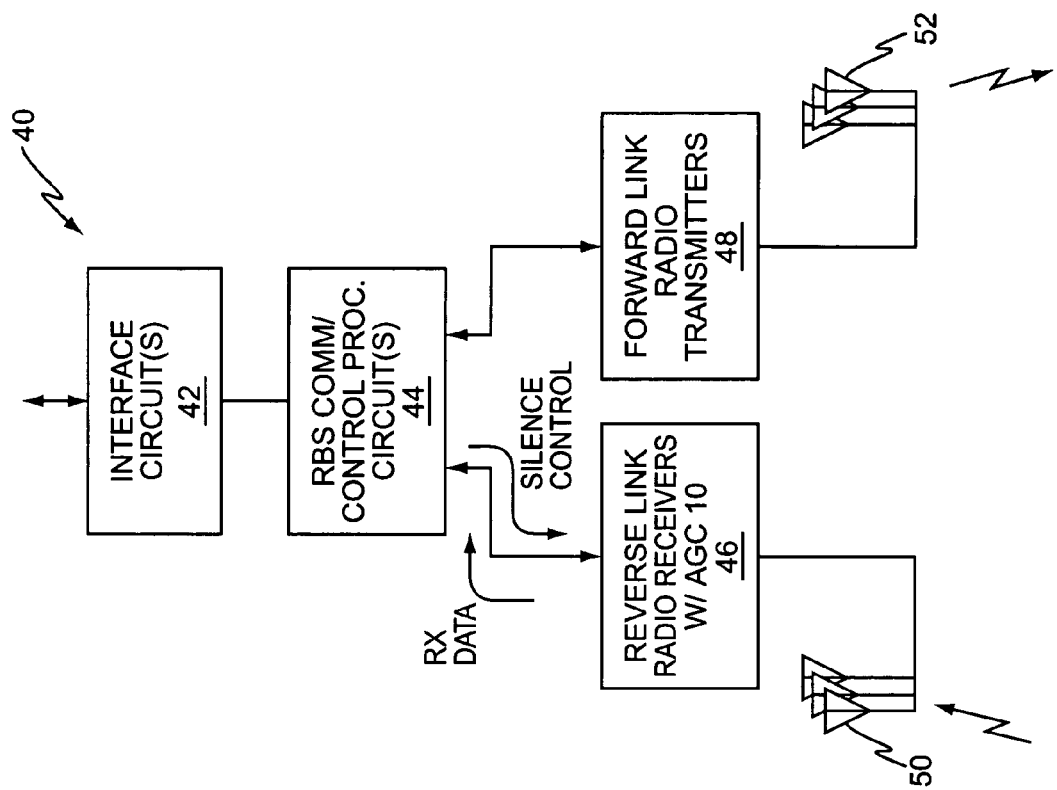
FIG. 8 is a diagram of an exemplary radio base station for use in a wireless communication network, and which incorporates automatic gain control for its reverse link receiver operations in accordance with the present invention.

Whether or not AGC circuit 10 is frozen or kept live during received signal disruptions, FIG. 8 illustrates an exemplary radio base station 40 that includes one or more AGC circuits 10 according to the present invention. Radio base station 40 is configured for use in a wireless communication network, such as a cellular communication network based on the IS-2000 or Wideband CDMA standards, for example. In an exemplary embodiment, radio base station 40 is configured for operation in a wireless radio network based on the 1xEV-DO or TIA-856 standards, in which timed reverse link silence periods are used to permit receiver noise measurements at the radio base stations within the network, and AGC circuit(s) 10 are used to improve receiver gain control as the silence periods end and the reverse link signals return.

The illustrated radio base station 40 comprises interface circuit(s) 42, which communicatively couple it to a supporting base station controller or other controlling network entity, radio base station communication and control processing circuit(s) 44, reverse link radio receivers 46, including one or more AGC circuits 10, and forward link radio transmitters 48. The receivers 46 and transmitters 48 received and transmit, respectively, using antenna elements 50 and 52.

In an exemplary arrangement, radio base station 40 includes two receive antenna elements per radio sector, and uses two radio receivers per sector, with each receiver having its own AGC function. Note that the radio receivers allocated to a given sector can be gain controlled separately within defined limits, but AGC for those receivers can be configured to control the maximum gain discrepancy permitted between the receivers.

In any case, it should be understood that receivers 46 include or are associated with one or more AGC circuits 10 to provide them with AGC compensation in accordance with the present invention. Because radio base station 40 typically will include a mix of hardware and software, and analog and digital circuits, the AGC circuit(s) 10 may be implemented in hardware, software, or any combination thereof. In an exemplary embodiment, each AGC circuit 10 includes digital processing logic configured to process digitized samples of the received signal of interest to that circuit 10, such that the signal strength (e.g., power) measurements, filtering, etc., associated with generating an AGC signal for the corresponding receiver are performed in the digital domain.

In particular, where received signal digitization is performed at a high sampling rate, AGC circuit 10 may be implemented at least partially in programmed hardware, such as one or more Field Programmable Gate Arrays (FPGAs), Application Specific Integrated Circuits (ASICs), and/or other Complex Programmable Logic Devices (CPLDs). Thus, the calculation circuit 30 and control circuit 32, including the filter circuit 34 and compensation circuit 36, may be wholly or partly implemented using programmed digital logic. That logic may be interfaced with, or may include, one or more memory registers that are configured to store control state information for the AGC circuit 10 and, in operation, the AGC logic can be configured to read and write to those memory registers as needed to maintain a running queue of filter state values, for example.

Of course, it should be understood that all or part of AGC circuit 10 can be implemented in a Digital Signal Processor (DSP), microprocessor, microcontroller, or other general logic circuit configured to execute stored program instructions. In that context, then, the present invention may be at least partially embodied as stored program instructions residing in (non-volatile) memory. In any case, it should be understood that these details may be varied based on the particular design requirements, and based on the resources of the system in which the inventive AGC circuit 10 is implemented.

Thus, whether implemented in analog form, or in digital form, whether in hardware or software, or both, the present invention contemplates compensating an AGC function within a receiver for one or more types of signal disruptions, so that AGC control is improved at least with regard to the transition from disrupted-to-non-disrupted signal conditions. An advantageous but non-limiting example of that method is illustrated by applying the present invention to receivers that use timed, repeating silence periods during which they measure their noise while the received signal is suspended, but after which they must quickly return to accurate gain control when the received signal returns.

As such, the present invention is not limited by the foregoing details. Indeed, the present invention is limited only by the following claims and their reasonable legal equivalents.

What is claimed is:

1. A method of automatic gain control at a wireless communication receiver comprising:
varying receiver gain via an automatic gain control circuit that is responsive to a received signal; and
compensating the automatic gain control circuit using remembered control state information if there is a disruption in the received signal;
wherein compensating the automatic gain control circuit using remembered control state information if there is a disruption in the received signal comprises, at the end of the disruption, resetting filter state information for the automatic gain control circuit using stored filter state information from a time prior to the beginning of the disruption.

2. The method of claim 1, further comprising maintaining a running buffer of filter state information for the automatic gain control circuit for use as the remembered control state information.

3. The method of claim 1, further comprising saving current filter state information for the automatic gain control circuit at successive sample times, and using saved filter state information from one or more sample times prior to a beginning of the disruption as the remembered control state information used to compensate the automatic gain control circuit.

4. The method of claim 3, further comprising detecting a start of the disruption, and using saved control information from the closest sample time before the detected start of the disruption as the remembered control state information used to compensate the automatic gain control circuit.

5. The method of claim 1, wherein compensating the automatic gain control circuit using remembered control state information if there is a disruption in the received signal comprises compensating the automatic gain control circuit for a silence period disruption in the received signal.

6. The method of claim 1, wherein compensating the automatic gain control circuit using remembered control state information if there is a disruption in the received signal comprises compensating the automatic gain control circuit for a jamming disruption in the received signal.

7. The method of claim 1, further comprising detecting if there is a disruption in the received signal and triggering said compensation of the automatic gain control circuit responsive thereto, said detection comprising at least one of detecting silence period disruptions and detecting jamming interruptions.

8. The method of claim 1, wherein varying receiver gain via an automatic gain control circuit that is responsive to a received signal comprises increasing or decreasing one or more receiver gains as needed to maintain signal samples derived from the received signal within a desired range.

9. The method of claim 8, wherein increasing or decreasing one or more receiver gains as needed to maintain signal samples derived from the received signal within a desired range comprises varying the receiver gain based on filtered power measurements obtained from the signal samples.

10. The method of claim 9, wherein resetting filter state information for the automatic gain control circuit using stored filter state information from a time prior to the beginning of the disruption comprises resetting a filter circuit used to obtain the filtered power measurements using the stored filter state information.

11. An automatic gain control circuit to provide automatic gain control for a wireless communication receiver, said automatic gain control circuit comprising one or more processing circuits configured to:
vary receiver gain responsive to a received signal; and
compensate for a disruption in the received signal using remembered control state information by, at the end of the disruption, resetting filter state information for the automatic gain control circuit using stored filter state information from a time prior to the beginning of the disruption.

12. The automatic gain control circuit of claim 11, wherein the one or more processing circuits comprise a calculation circuit configured to generate signal measurements for the received signal, and a control circuit configured to vary the receiver gain as a function of the signal measurements.

13. The automatic gain control circuit of claim 12, wherein the control circuit includes a filter configured to generate one or more gain control signals operative to vary the receiver gain based on filtering the signal measurements, and further includes a compensation circuit configured to reset the filter state information for the automatic gain control circuit using the stored filter state information from the time prior to the beginning of the disruption based on resetting the filter circuit using the stored filter state information.

14. The automatic gain control circuit of claim 11, wherein the automatic gain control circuit is configured to maintain a running buffer of filter state information for the automatic gain control circuit for use as the stored filter state information.

15. The automatic gain control circuit of claim 11, wherein the automatic gain control circuit is configured to save current filter state information for the automatic gain control circuit at successive sample times, and use saved filter state information from one or more sample times before a beginning of the disruption for use in compensating for the disruption.

16. The automatic gain control circuit of claim 15, wherein the automatic gain control circuit is configured to detect a start of the disruption, and use saved filter state information from the closest sample time before the detected start of the disruption as the filter state information used to compensate for the disruption.

17. The automatic gain control circuit of claim 11, wherein the automatic gain control circuit is configured to compensate for a silence period disruption in the received signal.

18. The automatic gain control circuit of claim 11, wherein the automatic gain control circuit is configured to compensate for a jamming disruption in the received signal.

19. The automatic gain control circuit of claim 11, wherein the automatic gain control circuit is configured to detect the disruption and trigger said compensation responsive thereto, said detection comprising at least one of detecting silence period disruptions and detecting jamming interruptions.

20. The automatic gain control circuit of claim 11, wherein the automatic gain control circuit is configured to vary receiver gain responsive to a received signal by increasing or decreasing one or more receiver gains as needed to maintain signal samples derived from the received signal within a desired range.

21. The automatic gain control circuit of claim 20, wherein the automatic gain control circuit is configured to vary the receiver gain based on filtered power measurements obtained from the signal samples.

22. The automatic gain control circuit of claim 21, wherein resetting filter state information for the automatic gain control circuit using stored filter state information from a time prior to the beginning of the disruption comprises resetting a filter circuit used to obtain the filtered power measurements using the stored filter state information.

23. A method of automatic gain control at a wireless communication receiver comprising:
   capturing an automatic gain control setting before a disruption in a received signal that is the subject of automatic gain control; and
   temporarily using the captured automatic gain control setting to compensate automatic gain control for the disruption;
   wherein capturing an automatic gain control setting before a disruption in a received signal that is the subject of automatic gain control comprises capturing filter state information for an automatic gain control circuit before a beginning of the disruption.

24. The method of claim 23, wherein capturing filter state information for an automatic gain control circuit before a beginning of the disruption comprises capturing filter state information at one or more times in advance of the disruption responsive to an indication that the disruption is impending.

25. The method of claim 23, wherein capturing filter state information for an automatic gain control circuit before a beginning of the disruption comprises capturing filter state information periodically, so that updated filter state information is available from one or more capture times that are in advance of the disruption.

26. A radio base station for use in a wireless communication network, the radio base station comprising:
   one or more receivers configured to receive a reverse link signal as a received signal;
   an automatic gain control circuit operatively associated with the one or more receivers and configured to:
      vary a receiver gain responsive to the received signal; and
      compensate automatic gain control of the one or more receivers for a disruption in the received signal using remembered control state saved for the automatic gain control circuit before a beginning of the disruption;
   wherein the automatic gain control circuit is configured to save control state information responsive to an indication that the disruption is impending.

27. The radio base station of claim 26, further comprising one or more base station processing circuits configured to generate the indication that the disruption is impending.

28. The radio base station of claim 26, wherein the automatic gain control circuit is configured to periodically save control state information at a desired update rate, so that remembered control state information is available from one or more update periods before the disruption.

29. The radio base station of claim 28, wherein the base station processing circuits are configured to measure reverse link loading during timed reverse link silence periods, and wherein the processing circuits generate the indication of impending received signal disruption in advance of each timed silence period, so that the automatic gain control circuit is compensated for silence period disruptions of the received signal.

30. A method of automatic gain control at a wireless communication receiver comprising:
   varying receiver gain via an automatic gain control circuit that is responsive to a received signal; and
   compensating the automatic gain control circuit using remembered control state information if there is a disruption in the received signal;
   wherein compensating the automatic gain control circuit using remembered control state information if there is a disruption in the received signal comprises freezing the automatic gain control circuit during the disruption using control state information stored prior to the disruption.

31. An automatic gain control circuit to provide automatic gain control for a wireless communication receiver, said automatic gain control circuit comprising one or more processing circuits configured to:
   vary receiver gain responsive to a received signal; and
   compensate for a disruption in the received signal using remembered control state information;
   wherein the one or more processing circuits comprise a calculation circuit configured to generate signal measurements for the received signal, and a control circuit configured to vary the receiver gain as a function of the signal measurements; and
   wherein the control circuit includes a filter configured to generate one or more gain control signals operative to vary the receiver gain based on filtering the signal measurements, and further includes a compensation circuit configured to compensate for a disruption in the received signal using remembered control state information by resetting the filter circuit using one or more stored filter state values corresponding to a time prior to the disruption.

* * * * *

UNITED STATES PATENT AND TRADEMARK OFFICE
CERTIFICATE OF CORRECTION

PATENT NO. : 7,349,501 B2 Page 1 of 1
APPLICATION NO. : 10/888452
DATED : March 25, 2008
INVENTOR(S) : Soong et al.

It is certified that error appears in the above-identified patent and that said Letters Patent is hereby corrected as shown below:

On the Title Page, in Field (56), under "OTHER PUBLICATIONS", in Column 2, Line 3, delete "Ausut" and insert -- August --, therefor.

In Column 9, Line 58, in Claim 6, delete "lamming" and insert -- jamming --, therefor.

Signed and Sealed this

Eleventh Day of November, 2008

JON W. DUDAS
*Director of the United States Patent and Trademark Office*